(12) United States Patent
Jung et al.

(10) Patent No.: US 8,068,157 B2
(45) Date of Patent: Nov. 29, 2011

(54) IMAGE SENSOR WITH WIDE OPERATING RANGE

(75) Inventors: Sang-Il Jung, Seoul (KR); Min-Young Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 603 days.

(21) Appl. No.: 12/218,287

(22) Filed: Jul. 14, 2008

(65) Prior Publication Data

US 2009/0027529 A1   Jan. 29, 2009

(30) Foreign Application Priority Data

Jul. 16, 2007   (KR) .................. 10-2007-0071330

(51) Int. Cl.
*H04N 3/14* (2006.01)
*H01L 27/92* (2006.01)
*H01L 29/26* (2006.01)
*H01L 29/02* (2006.01)

(52) U.S. Cl. ......... 348/308; 257/371; 257/403; 257/549

(58) Field of Classification Search .......... 348/294–308; 438/286

See application file for complete search history.

(56) References Cited

U.S. PATENT DOCUMENTS

| | | | | |
|---|---|---|---|---|
| 5,614,744 A * | 3/1997 | Merrill | ............ | 257/291 |
| 7,470,946 B2 * | 12/2008 | Hsu et al. | ............ | 257/292 |
| 2003/0025816 A1 * | 2/2003 | Sakuragi | ............ | 348/301 |
| 2003/0063206 A1 * | 4/2003 | Mabuchi | ............ | 348/301 |
| 2004/0051164 A1 * | 3/2004 | Fossum | ............ | 257/595 |
| 2004/0169127 A1 * | 9/2004 | Ohkawa | ............ | 250/214.1 |
| 2004/0195592 A1 * | 10/2004 | Fossum | ............ | 257/202 |
| 2005/0253177 A1 * | 11/2005 | Fossum | ............ | 257/292 |
| 2006/0043520 A1 * | 3/2006 | Jerdev et al. | ............ | 257/462 |
| 2006/0044438 A1 * | 3/2006 | Mauritzson et al. | ............ | 348/308 |
| 2006/0081957 A1 * | 4/2006 | Itonaga et al. | ............ | 257/444 |
| 2006/0119720 A1 * | 6/2006 | Hong | ............ | 348/308 |
| 2006/0275990 A1 * | 12/2006 | Itonaga | ............ | 438/286 |
| 2006/0278809 A1 * | 12/2006 | Takayanagi | ............ | 250/208.1 |
| 2007/0076110 A1 * | 4/2007 | Mabuchi | ............ | 348/308 |
| 2007/0097241 A1 * | 5/2007 | Mabuchi | ............ | 348/308 |
| 2007/0114584 A1 * | 5/2007 | Jerdev et al. | ............ | 257/292 |
| 2007/0114585 A1 * | 5/2007 | Jerdev et al. | ............ | 257/292 |
| 2007/0120982 A1 * | 5/2007 | Oita et al. | ............ | 348/207.99 |
| 2007/0131993 A1 * | 6/2007 | Oita et al. | ............ | 257/292 |

OTHER PUBLICATIONS

Korean Patent Application No. 1020040097671 to Ahn et al., having Publication date of May 30, 2006 (w/ English Abstract page).
Korean Patent Application No. 1020050029953 to Roh et al., having Publication date of Oct. 17, 2006 (w/ English Abstract page).
Korean Patent Application No. 1020050051555 to Hynecek, having Publication date of Dec. 20, 2006 (w/ English Abstract page).

* cited by examiner

*Primary Examiner* — Sinh Tran
*Assistant Examiner* — Selam Gebriel
(74) *Attorney, Agent, or Firm* — Monica H. Choi

(57) ABSTRACT

An image sensor includes a photoelectric converter, a source-follower transistor, and a selection transistor. The photoelectric converter generates electric charge in response to received light, and the electric charge varies a voltage of a detection node. The source-follower transistor is coupled between the detection node and an output node and has a first threshold voltage. The selection transistor is coupled between the source-follower transistor and a voltage node with a power supply voltage or a boosted voltage applied thereon, and has a second threshold voltage with a magnitude that is less than a magnitude of the first threshold voltage such that the source-follower transistor operates in saturation.

19 Claims, 9 Drawing Sheets

IMAGE SENSOR WITH WIDE OPERATING RANGE

This application claims priority under 35 USC §119 to Korean Patent Application No. 10-2007-0071330, filed on Jul. 16, 2007 in the Korean Intellectual Property Office, the disclosure of which is incorporated herein in its entirety by reference.

BACKGROUND OF THE INVENTION

1. Field of the Invention

The present invention relates generally to image sensors, and more particularly, to a metal-oxide semiconductor (MOS) image sensor having source-follower transistors operating in saturation for a wide operating range.

2. Background of the Invention

Generally, image sensors convert an optical image into electric signals. With developments in the computer and communication industries, image sensors are in high demand especially with improved performance, such as in digital cameras, camcorders, personal communication systems, gaming devices, security cameras, medical micro-cameras, or robots, for example.

Metal oxide semiconductor (MOS) image sensors are easy to drive and may be driven with various scanning techniques. Additionally, the MOS image sensor with a signal processor is easily integrated into a single chip having miniaturized size and reduced manufacturing cost using typical MOS fabrication processes. The power consumption of the MOS image sensor is relatively low such that the MOS image sensor is amenable for application in devices with limited battery capacity. Accordingly, use of MOS image sensors with high resolution has dramatically increased.

Each pixel in a MOS image sensor includes a photoelectric converter that generates electric charge in response to received light. Such electric charge varies the voltage of a detection node. In addition, each pixel includes a source-follower transistor that is coupled to the detection node for generating an output signal indicating the amount of electric charge transferred to the detection node. Such a source-follower transistor is desired to operate in the saturation region.

SUMMARY OF THE INVENTION

Accordingly in the present invention, a magnitude of a threshold voltage of a source-follower transistor in an image sensor is increased for ensuring that the source-follower transistor operates in saturation.

An image sensor according to an aspect of the present invention includes a photoelectric converter, a source-follower transistor, and a selection transistor. The photoelectric converter generates electric charge in response to received light, and the electric charge varies a voltage of a detection node. The source-follower transistor is coupled between the detection node and an output node and has a first threshold voltage. The selection transistor is coupled between the source-follower transistor and a voltage node and has a second threshold voltage with a magnitude that is less than a magnitude of the first threshold voltage.

In an example embodiment of the present invention, the selection transistor and the source-follower transistor are enhancement type NMOSFETs (N-channel metal oxide semiconductor field effect transistors). For example, the source-follower transistor has a drain coupled to a source of the selection transistor, a gate coupled to the detection node, and a source coupled to the output node. In addition, the selection transistor has a gate with a selection control signal applied thereon and a drain coupled to the voltage node.

In a further embodiment of the present invention, respective voltages with a substantially same level are applied on the gates of the selection transistor and the source-follower transistor. For example, the image sensor further includes a reset transistor having a drain coupled to the voltage node, a gate with a reset control signal applied thereon, and a source coupled to the detection node. A power supply voltage is applied to the voltage node and to the gate of the selection transistor via the reset transistor.

In an alternative embodiment of the present invention, a first voltage is applied on the gate of the selection transistor, and a second voltage that is higher than the first voltage is applied on the gate of the source-follower transistor. For example, the image sensor includes a reset transistor having a drain coupled to the voltage node, a gate with a reset control signal applied thereon, and a source coupled to the detection node. A boosted voltage is applied on the voltage node, and a power supply voltage lower than the boosted voltage is applied on the gate of the selection transistor.

In an example embodiment of the present invention, a gate of the source-follower transistor has a higher concentration of holes than a gate of the selection transistor. For example, the gate of the source-follower transistor has a P-type conductivity, and the gate of the selection transistor has an N-type conductivity.

In another embodiment of the present invention, the image sensor further includes a transfer transistor coupled between the photoelectric converter and the detection node.

In an example embodiment of the present invention, the photoelectric converter is a photodiode, and the image sensor is a CMOS (complementary metal oxide semiconductor) image sensor.

An image sensor according to another aspect of the present invention includes a photoelectric converter and a source-follower transistor having respective source/drain regions and a respective gate. The photoelectric converter generates electric charge in response to received light, and the electric charge varies a voltage of a detection node. The source-follower transistor is coupled between the detection node and an output node. The respective source/drain regions are of a first conductivity type formed in a semiconductor substrate for the source-follower transistor. The respective gate of the source-follower transistor is of a second conductivity type that is opposite of the first conductivity type.

In an example embodiment of the present invention, the source-follower transistor further includes a respective channel region with a dopant of the second conductivity type disposed between the respective source/drain regions.

In another embodiment of the present invention, the image sensor further includes a selection transistor coupled between the source-follower transistor and a voltage node. The selection transistor has a respective threshold voltage with a magnitude that is less than a magnitude of a respective threshold voltage of the source-follower transistor.

In an example embodiment of the present invention, the selection transistor includes respective source/drain regions, a respective channel region, and a respective gate. The respective source/drain regions of the first conductivity type are formed in the semiconductor substrate. The respective channel region has a dopant of the second conductivity type. The respective gate of the first conductivity type is disposed over the respective channel region.

An image sensor according to another aspect of the present invention includes a photoelectric converter and a source-follower transistor. The photoelectric converter generates electric charge in response to received light, and the electric charge varies a voltage of a detection node. The source-follower transistor is coupled between the detection node and an output node. The source-follower transistor includes a drain with a power supply voltage minus a respective threshold voltage of another transistor applied thereon. The source-follower transistor also includes a gate with a boosted voltage that is higher than the power supply voltage applied thereon.

In an example embodiment of the present invention, the other transistor is a selection transistor coupled between the source-follower transistor and a voltage node. The selection transistor has the respective threshold voltage with a magnitude that is less than a magnitude of a respective threshold voltage of the source-follower transistor.

For example, the magnitude of the respective threshold voltage of the source-follower transistor is higher than the magnitude of the respective threshold voltage of the selection transistor by at least the boosted voltage minus the power supply voltage. In an example embodiment of the present invention, the boosted voltage is applied on the gate of the source-follower transistor through a reset transistor, and the power supply voltage minus the respective threshold voltage of the selection transistor is applied on the drain of the source-follower transistor.

In this manner, the selection transistor is coupled between the source-follower transistor and the voltage node having the power supply voltage or the boosted power voltage applied thereon for more stable operation of the source-follower transistor. In addition, the magnitude of the threshold voltage of the source-follower transistor is greater than the magnitude of the threshold voltage of the selection transistor for ensuring that the source-follower transistor operates in saturation.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6A, 6B, 7, and 8 refer to elements having similar structure and/or function.

DETAILED DESCRIPTION OF THE INVENTION

Exemplary embodiments of the present invention are now described in detail for an example complementary metal-oxide semiconductor (CMOS) image sensor. However, the present invention may be practiced for an image sensor formed with an N-type metal-oxide semiconductor (NMOS) process, a P-type metal-oxide semiconductor (PMOS) process, and/or a CMOS process forming both NMOS and PMOS devices.

Figure 1:
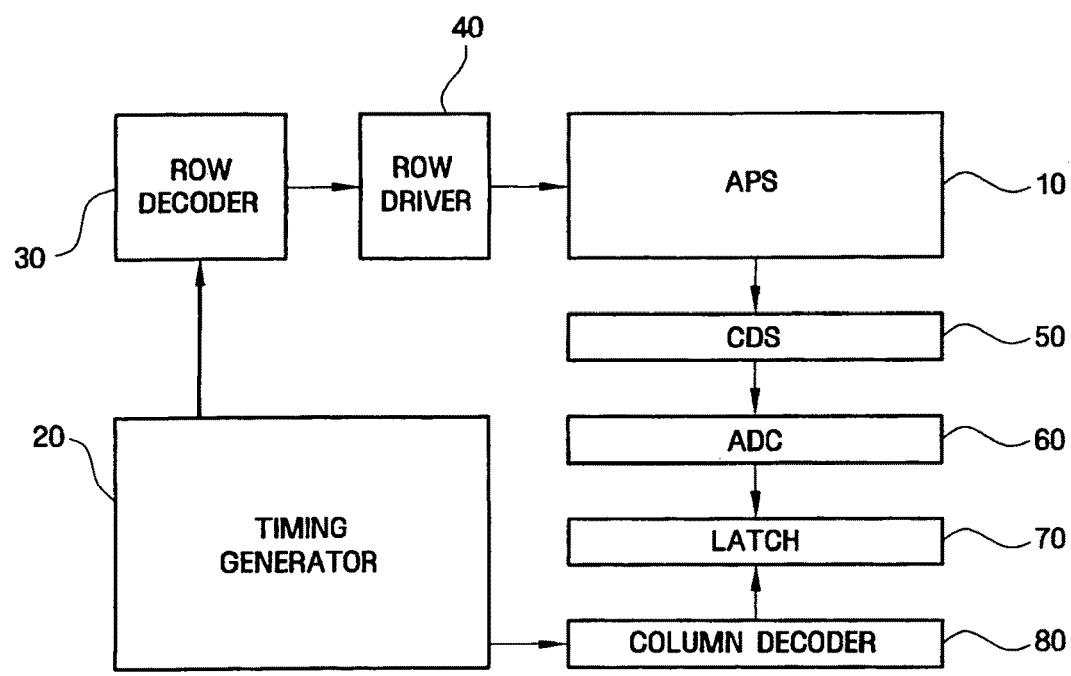
FIG. 1 illustrates a block diagram of an image sensor according to an example embodiment of the present invention.

FIG. 1 shows a block diagram of an image sensor according to an exemplary embodiment of the present invention. Referring to FIG. 1, the image sensor includes an active-pixel sensor (APS) array 10, a timing generator 20, a row decoder 30, a row driver 40, a correlated double sampler (CDS) 50, an analog-to-digital converter (ADC) 60, a latch 70, and a column decoder 80.

The APS array 10 is a two-dimensional array of a plurality of pixels each including a respective photoelectric converter. The pixels convert an optical image into electrical signals. The APS array 10 is driven in response to a plurality of driving signals such as a selection control signal SEL, a reset control signal RX, and a charge-transfer control signal TX generated from the row driver 30. The electrical signals generated by the APS array 10 are provided to the CDS 50 via vertical signal lines (not shown).

The timing generator 20 provides a timing signal and a control signal to the row decoder 30 and the column decoder 80. The row driver 40 provides the plurality of driving signals SEL, RX, and TX for driving the pixels of the APS array 10 from decoding by the row decoder 30 of the timing and control signals from the timing generator 20. For example, when the APS array 10 has the matrix of pixels, the row driver 40 provides driving signals to a row of pixels at a time.

The CDS 50 holds and samples the electrical signals from the APS array 10 via the vertical signal lines. For example, the CDS 50 samples both a reset level representing a noise level and a signal level representing an image level to generate an analog signal of the difference between the image and reset levels to eliminate noise.

The ADC 60 converts the analog signal generated by the CDS 50 into a digital signal. The latch 70 latches the digital signal generated by the ADC 60. Such latched digital signal is output to an image signal processor (not shown) according to decoding performed by the column decoder 80.

Figure 2:
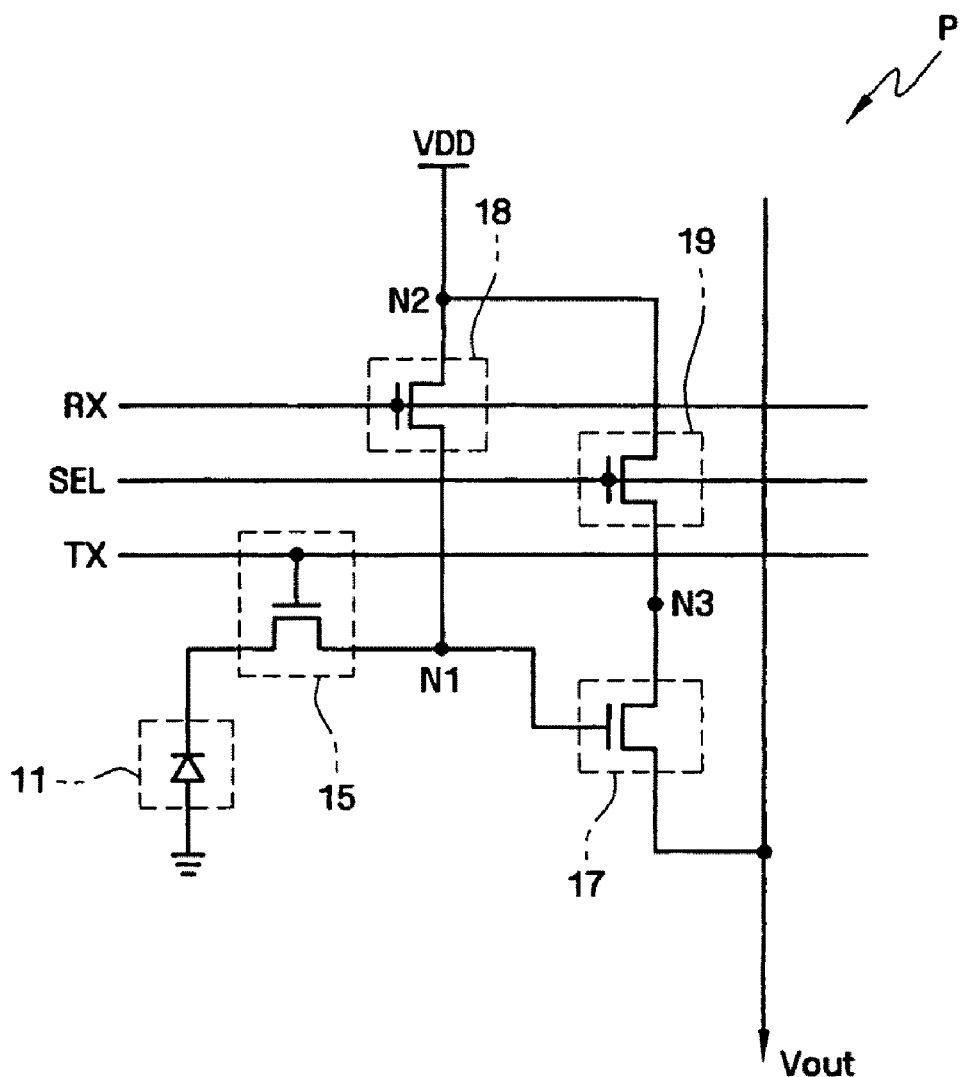
FIG. 2 illustrates a circuit diagram of a pixel in the image sensor of FIG. 1, according to an example embodiment of the present invention.
Figure 3:
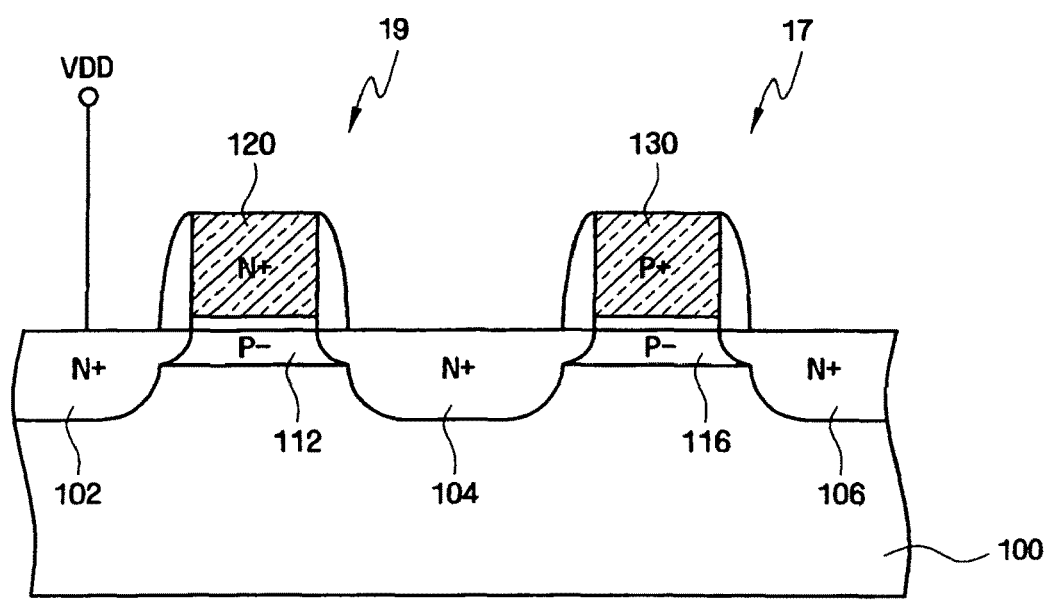
FIG. 3 illustrates a cross-sectional view of a selection transistor and a source-follower transistor in the pixel of FIG. 2, according to an example embodiment of the present invention.
Figure 4:
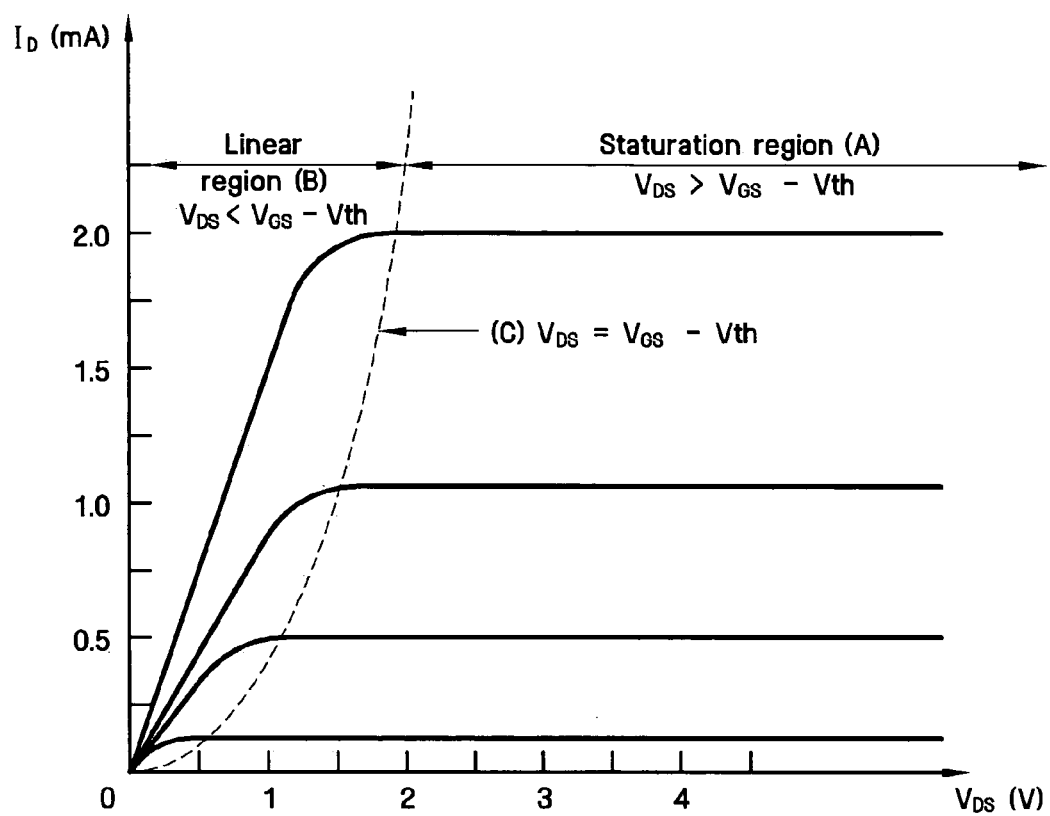
FIG. 4 illustrates a current voltage characteristic including a saturation region and a linear region for a metal-oxide semiconductor (MOS) transistor.

FIG. 2 shows a circuit diagram of an example pixel P in the APS array 10 of the image sensor of FIG. 1, according to an example embodiment of the present invention. FIG. 3 shows a cross-sectional view of a selection transistor 19 and a source-follower transistor 17 in the pixel of FIG. 2. FIG. 4 shows a current-voltage characteristic including a saturation region and a linear region during operation of a MOS (metal oxide semiconductor) transistor.

Referring to FIG. 2, the pixel P includes four transistors 15, 17, 18, and 19. However, the present invention is not restricted thereto. For example, the present invention may also be practiced for a pixel having three transistors or five transistors. The pixel P includes a photoelectric converter 11, a transmission transistor 15, a source-follower transistor 17, a reset transistor 18, and a selection transistor 19.

The photoelectric converter 11 accumulates an amount of electric charge corresponding to the intensity of light reaching the photoelectric converter 11. For example, the photoelectric converter 11 includes a photodiode, a phototransistor, a photogate, a pinned photodiode, or a combination thereof. In the example of FIG. 2, the photoelectric converter 11 includes a photodiode.

The photoelectric converter 11 is connected to the transmission transistor 15 which is controlled to transfer the accumulated electric charge from the photoelectric converter 11 to a detection node N1. The transmission transistor 15 is driven by the transmission control signal TX applied on a gate of the transmission transistor 15. The detection node N1 is electrically floating, and is commonly referred to as a floating diffusion region. The detection node N1 includes a parasitic capacitance for storing electric charge therein.

The reset transistor 18 periodically resets the detection node N1. The reset transistor 18 has a source coupled to the detection node N1 and a drain coupled to a voltage node N2. The reset transistor 18 is driven by the reset control signal RX applied at a gate of the reset transistor 18. When the reset transistor 18 is turned on in response to the reset signal RX, a voltage applied on the voltage node N2, such as a power supply voltage VDD for example, is transmitted to the detection node N1 for resetting the detection node N1.

The selection transistor 19 is for selecting or unselecting the pixel P to generate the electrical signals representing the amount of electric charge accumulated by the photoelectric converter 11 as an output signal Vout on a respective vertical signal line. The selection transistor 19 has a drain connected to the voltage node N2 and a source connected to a drain of the source-follower transistor 17. The selection transistor 19 is driven by the selection control signal SEL applied on a gate 120 of the selection transistor 19.

The source-follower transistor 17 generates the electrical signal Vout indicating the amount of electric charge stored at the detection node N1. More specifically, the source-follower transistor 17 is coupled to a current source (not shown) for conducting a fixed current. Accordingly, a source voltage $V_S$ of the source-follower transistor 17 varies proportionally to a gate voltage $V_G$ (i.e., the voltage at the detection node N1) of the source-follower transistor 17.

The CDS 50 senses a variation in the source voltage $V_S$. Therefore, a proportional relationship (more particularly, a linear relationship) between the source voltage $V_S$ and the gate voltage $V_G$ is desired. In order for the source voltage Vs and the gate voltage $V_G$ to have a linear relationship, the source-follower transistor 17 should operate in the saturation region.

More specifically referring to FIG. 4, a MOS (metal oxide semiconductor) transistor operates in the saturation region A when a difference of the gate-to-source voltage $V_{GS}$ and the threshold voltage Vth (i.e., $V_{GS}$–Vth) is less than a drain-to-source voltage $V_{DS}$. Such a MOS transistor operates in a linear region B when the drain-to-source voltage $V_{DS}$ is less than the difference of the gate-to-source voltage $V_{GS}$ and the threshold voltage Vth (i.e., $V_{GS}$–Vth). A boundary C between the saturation region A and the linear region B is referred to as a pinch-off point. The boundary C is when the drain-to-source voltage $V_{DS}$ is same as the difference of the gate-to-source voltage $V_{GS}$ and the threshold voltage Vth (i.e., $V_{GS}$–Vth).

When the MOS transistor operates in the saturation region A, a drain current $I_D$ of the MOS transistor is represented by the following Equation (1):

$$I_D \alpha (V_{GS}-Vth)^2 \quad \text{Equation (1).}$$

On the other hand, when the MOS transistor operates in the linear region B, the drain current $I_D$ is represented by the following Equation (2):

$$I_D \alpha \{(V_{GS}-Vth)V_{DS}-\tfrac{1}{2}V_{DS}^2\} \quad \text{Equation (2).}$$

Referring to Equation (1), the drain current $I_D$ is determined by the gate-to-source voltage $V_{GS}$ when the MOS transistor operates in the saturation region. In contrast referring to Equation (2), the drain current $I_D$ is determined not only by the gate-to-source voltage $V_{GS}$ but also by the drain-to-source voltage $V_{DS}$ when the MOS transistor operates in the linear region.

That is, if the source-follower transistor 17 operates in the saturation region A when the drain current $I_D$ is uniform, the source voltage $V_S$ is affected by just the gate voltage $V_G$. However, if the source-follower transistor 17 operates in the linear region B when the drain current $I_D$ is uniform, the source voltage $V_S$ is affected not only by the gate voltage $V_G$ but also by a drain voltage $V_D$ of the source-follower transistor 17. Therefore, in order for the source voltage $V_S$ and the gate voltage $V_G$ to have a linear relationship, the source-follower transistor 17 is desired to operate in the saturation region A.

Because the selection transistor 19 is disposed between the source-follower transistor 17 and the voltage node N2, the power supply rejection ratio (PSRR) characteristics of the pixel P are improved. More specifically, the source-follower transistor 17 is desired to operate stably for generating the output signal Vout with minimized noise.

If the source-follower transistor 17 were directly connected to the voltage node N2 on which the power supply voltage VDD is applied, noise may be generated in the output signal Vout of the source-follower transistor 17 from fluctuation in the power supply voltage VDD. The selection transistor 19 which is disposed between the source-follower transistor 17 and the voltage node N2 prevents the fluctuation in the power supply voltage VDD from affecting the source-follower transistor 17.

However if the selection transistor 19 is disposed between the source-follower transistor 17 and the voltage node N2, the source-follower transistor 17 tends to operate at the boundary between the saturation region A and the linear region B and thus may not be able to operate stably. That is, the linearity characteristics of the source-follower transistor 17 may deteriorate as now described in more detail.

In an example embodiment of the present invention, the source-follower transistor 17 and the selection transistor 19 are enhancement-type NMOSFETs (N-channel metal oxide semiconductor field effect transistors), whereas the reset transistor 18 is a depletion-type NMOSFET. Also in this example embodiment, the power supply voltage VDD is about 2.8V, and a threshold voltage Vth of the selection NMOSFET 19 is about 0.6V.

The source-follower transistor 17 has a first threshold voltage $Vth_1$ with a first magnitude, and the selection transistor 19 has a second threshold voltage $Vth_2$ with a second magnitude, in an example embodiment of the present invention. When the reset transistor 18 resets the detection node N1, the voltage at the detection node N1 becomes about 2.8V. In addition, the voltage at the drain N3 of the source-follower transistor 17 becomes the threshold voltage $Vth_2$ of the selection transistor 19 subtracted from the power supply voltage VDD (i.e., 2.2V=2.8V–0.6V).

If the threshold voltages $Vth_1$ and $Vth_2$ of the selection and source-follower transistors 19 and 15 are the same at about 0.6 Volts, the difference between the gate-to-source voltage $V_{GS}$ and the threshold voltage $Vth_1$ of the source-follower transistor 17 is same as the drain-to-source voltage $V_{DS}$ of the source-follower transistor 17 as illustrated by Equations (3) below:

$$V_{GS}-Vth_1=V_G-V_S-Vth_1=2.8V-V_S-0.6V=2.2V-V_S;$$

$$V_{DS}=V_D-V_S=2.2\text{V}-V_S;$$

Thus, $V_{GS}-Vth_1=V_{DS}$  Equations (3).

As a result, the source-follower transistor 17 operates at the boundary between the saturation region A and the linear region B. In that case, the source-follower transistor 17 cannot generate the output signal Vout (i.e., the source voltage, $V_S$) that is proportional to the voltage at the detection node N1 (i.e., the gate voltage, $V_G$).

For correcting such a problem in an aspect of the present invention, a magnitude of the respective threshold voltage $Vth_2$ of the selection transistor 19 is designed to be less than a magnitude of the respective threshold voltage $Vth_1$ of the source-follower transistor 17. For example referring to FIG. 3, a respective gate 130 of the source-follower transistor 17 has a first work function, and the respective gate 120 of the selection transistor 19 has a second work function that is lower than the first work function.

When the source-follower transistor 17 and the selection transistor 19 are NMOSFETs in FIG. 3, the gate 130 of the source-follower transistor 17 has a higher concentration of holes than the gate 120 of the selection transistor 19. For example, the gate 130 of the source-follower transistor 17 is comprised of a semiconductor material of P-type conductivity, and the gate 120 of the selection transistor 19 is comprised of a semiconductor material of N-type conductivity.

Further referring to FIG. 3, the selection transistor 19 also includes respective source/drain regions 102 and 104 doped to have N-type conductivity and includes a respective channel region 112 doped to have P-type conductivity under the gate 120 and between the source/drain regions 102 and 104. The source-follower transistor 17 also includes respective source/drain regions 104 and 106 doped to have N-type conductivity and includes a respective channel region 116 doped to have P-type conductivity under the gate 120 and between the source/drain regions 104 and 106.

Doping the channels 112 and 116 with a higher concentration of a P-type dopant increases the respective threshold voltages of the enhancement-type NMOSFETs 19 and 17. With such doping of the channels 112 and 116, the leakage current is minimized by completely turning off the NMOSFETs 19 and 17.

In addition for the enhancement-type NMOSFETs 19 and 17, a magnitude of the respective threshold voltage is increased with a higher concentration of any P-type dopant in the gate electrodes 120 or 130. Thus in FIG. 3, the source-follower transistor 17 has the respective threshold voltage $Vth_1$ with a magnitude that is higher than a magnitude of the respective threshold voltage $Vth_2$ of the selection transistor 19.

For the example of the enhancement type NMOSFETs 19 and 17, the respective threshold voltage $Vth_1$ of the source-follower transistor 17 is higher than the respective threshold voltage $Vth_2$ of the selection transistor 19 by $\Delta\phi$ (i.e., $Vth_1=Vth_2+\Delta\phi$). Here, $\Delta\phi=\phi1-\phi2$ where $\phi1$ is a respective work function of the gate 130 of the source-follower transistor 130, and $\phi2$ is a work function of the gate 120 of the selection transistor 120.

In that case, the source-follower transistor 17 is ensured to operate stably in the saturation region A and for a wider operating range (i.e., a wider range of the output signal Vout) such that the linearity characteristics of the source-follower transistor 17 are improved.

In an example embodiment of the present invention, the power supply voltage VDD is about 2.8V, the second threshold voltage $Vth_2$ of the selection transistor 19 is about 0.6V, and the first threshold voltage $Vth_1$ of the source-follower transistor 17 is about $0.6\text{V}+\Delta\phi$. When the reset transistor 18 that is a depletion type NMOSFET resets the detection node N1, the voltage of the detection node N1 becomes 2.8V.

In addition, the power supply voltage VDD is applied on the gate of the selection transistor 19. In that case, the voltage at the drain N3 of the source-follower transistor 17 becomes the power supply voltage VDD minus the second threshold voltage $Vth_2$ of the selection transistor 19. Thus, the voltage at the drain N3 of the source-follower transistor 17 becomes 2.2V (=VDD−$Vth_2$=2.8V−0.6 V).

In that case for the source-follower transistor 17, its gate-to-source voltage $V_{GS}$ minus its threshold voltage $Vth_1$ (=$Vth_2+\Delta\phi$) is less than its drain-to-source voltage $V_{DS}$, as illustrated by Equations (4) below:

$$V_{GS}-Vth_1=V_{GS}-(Vth_2+\Delta\phi)=V_G-V_S-(Vth_2+\Delta\phi)$$
$$=2.8\text{V}-V_S-(0.6\text{V}+\Delta\phi)=2.2\text{V}-V_S-\Delta\phi$$

$$V_{DS}=V_D-V_S=2.2\text{V}-V_S$$

Thus, $V_{GS}-Vth_1<V_{DS}$  Equations (4).

As a result, the source-follower transistor 17 is ensured of operating in the saturation region A for generating the output signal Vout (i.e., its source voltage $V_S$) that is proportional to the voltage at the detection node N1 (i.e., its gate voltage $V_G$).

Figure 5:
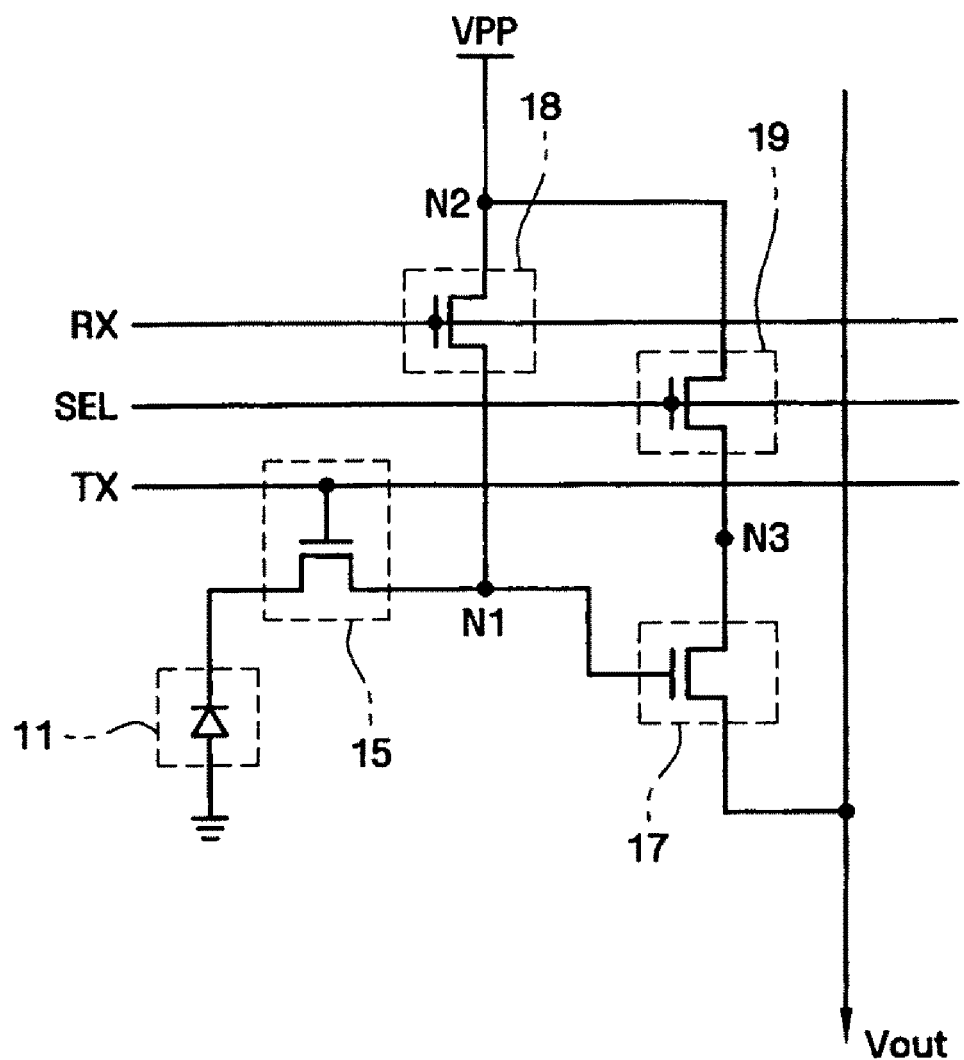
FIG. 5 illustrates a circuit diagram of a pixel in the image sensor of FIG. 1, according to another example embodiment of the present invention.

FIG. 5 shows a circuit diagram of a pixel in the image sensor of FIG. 1, according to another example embodiment of the present invention. Elements having the same reference number in FIGS. 2 and 5 refer to elements having similar structure and/or function. However, the pixel of FIG. 5 differs from the pixel of FIG. 2 in that in FIG. 5, a boosted voltage VPP that is higher than the power supply voltage VDD is applied to the voltage node N2. Thus in FIG. 5, the reset transistor 18 resets the detection node N1 to the boosted voltage VPP.

In addition, the transmission transistor 15 transfers the electric charge generated by the photoelectric converter 11 to the detection node N1 in response to the transmission control signal TX having a level same as the boosted voltage VPP. As a result, substantially all of the electric charge accumulated in the photoelectric converter 11 is transmitted to the detection node N1, thereby preventing an image lag.

The selection transistor 19 operates in response to a selection control signal SEL activated to a level that is lower than the boosted voltage VPP. For example, the selection control signal SEL may be activated to the power supply voltage VDD. Similar to the embodiment of FIG. 2, the selection transistor 19 and the source-follower transistor 17 of FIG. 5 have the gates 120 and 130, respectively, of FIG. 3 such that the source-follower transistor 17 has the respective threshold voltage $Vth_1$ (=$Vth_2+\Delta\phi$) with a higher magnitude than that of the respective threshold voltage $Vth_2$ of the selection transistor 19.

Accordingly, the source-follower transistor 17 is ensured of operating in the saturation region (A). In the example embodiment of FIG. 5, the boosted voltage VPP is about 3.3V, and the power supply voltage VDD is about 2.8V. Also in FIG. 5, the selection control signal SEL applied to the gate of the selection transistor 19 is activated to the power supply voltage VDD of about 2.8V. The respective threshold voltage $Vth_2$ of the selection transistor 19 is about 0.6V, and the respective threshold voltage $Vth_1$ (=$Vth_2+\Delta\phi$) of the source-follower transistor 17 is about $0.6\text{V}+\Delta\phi$.

When the reset transistor 18 resets the detection node N1, the voltage at the detection node N1 becomes 3.3 V. In addition, the voltage at the drain node N3 of the source-follower transistor 17 becomes the activated level (i.e., VDD=2.8V) of the selection control signal SEL minus the threshold voltage (Vth$_2$=0.6V) of the selection transistor 19. Thus, the voltage at the drain node N3 of the source-follower transistor 17 becomes V$_D$=2.2V (=2.8V−0.6V).

If Δϕ is greater than the boosted voltage VPP minus the power supply voltage VDD (i.e., Δϕ>VPP−VDD), the source-follower transistor 17 operates in the saturation region (A) in FIG. 5. For the example of FIG. 5, if Δϕ>0.5V, the gate-to-source voltage V$_{GS}$ minus the respective threshold voltage Vth$_1$ (=Vth$_2$+Δϕ) for the source-follower transistor 17 is less than the drain-to-source voltage V$_{DS}$, as illustrated by the Equations (5) below:

$$V_{GS}-Vth_1 = V_{GS}-(Vth_2+\Delta\phi) = V_G-V_S-(Vth_2+\Delta\phi)$$
$$= 3.3V-V_S-(0.6V+\Delta\phi) = 2.7V-V_S-\Delta\phi$$

$$V_{DS} = V_D - V_S = 2.2V - V_S$$

Thus, $V_{GS}-Vth_1 < V_{DS}$ (if Δϕ>0.5V)    Equations (5).

As a result, the source-follower transistor 17 operates in the saturation region A such that the source-follower transistor 17 generates the output signal Vout (i.e., the source voltage V$_S$) that is proportional to the voltage at the detection node N1 (i.e., the gate voltage V$_G$).

Figure 6A:
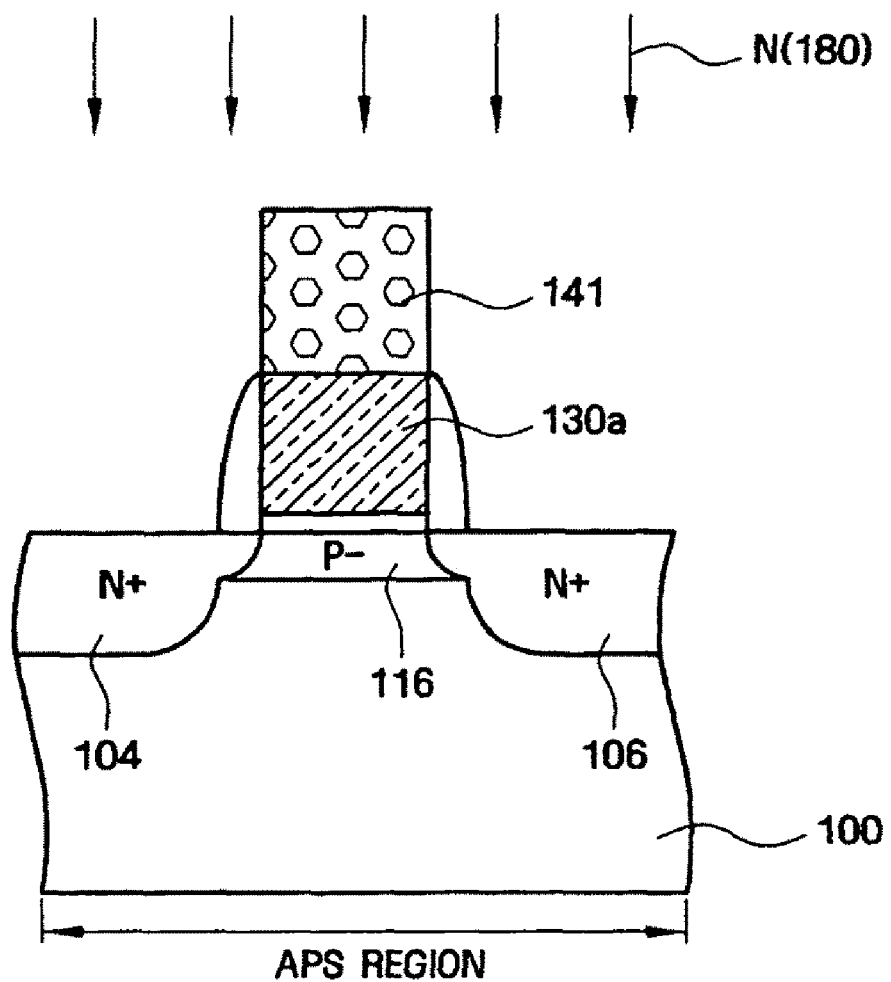
FIGS. 6A and 6B illustrate cross-sectional views during fabrication of the source-follower transistor of FIG. 3, according to an example embodiment of the present invention.
Figure 6B:
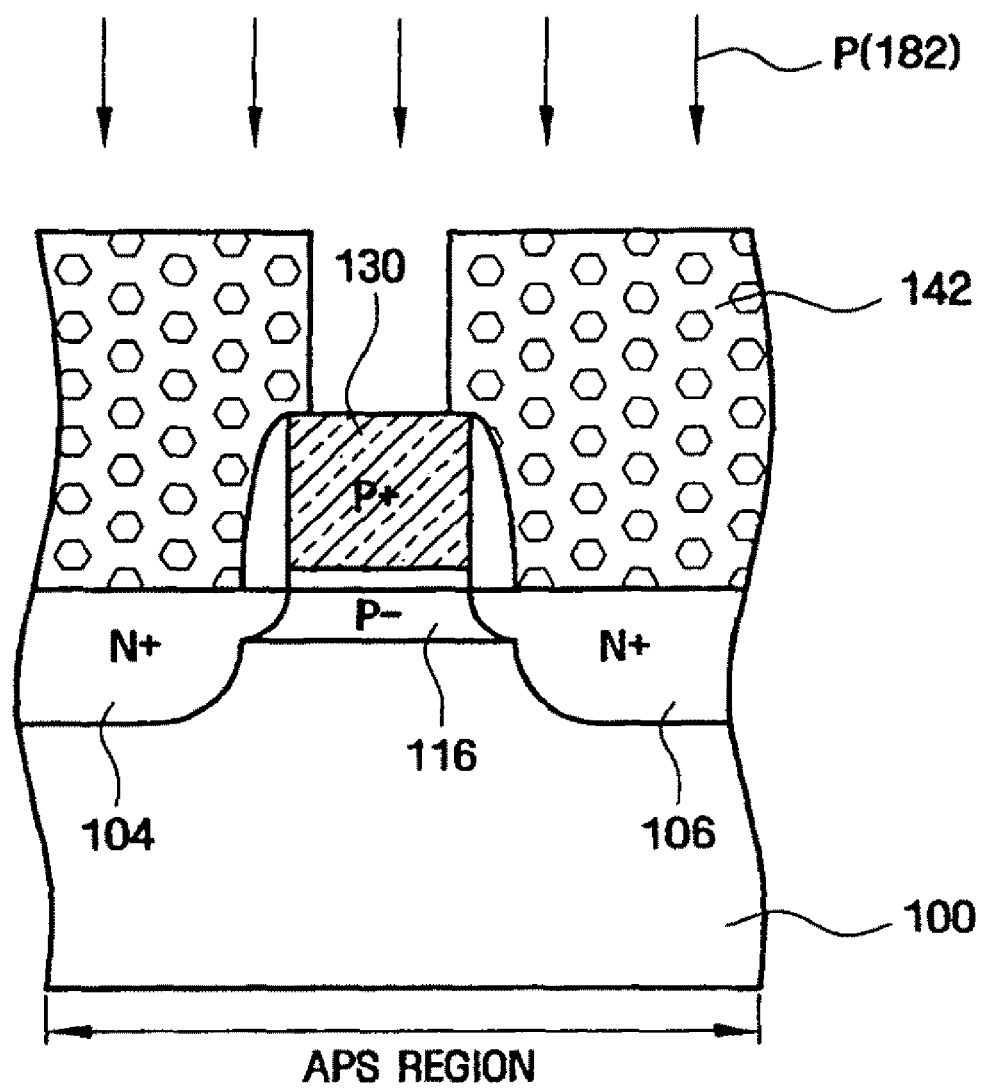

FIGS. 6A and 6B show cross-sectional views for fabricating a source-follower transistor in a pixel of an image sensor according to an example embodiment of the present invention. For example, the source-follower transistor of FIGS. 6A and 6B is the source-follower transistor 17 of FIGS. 2 and 5. Referring to FIG. 6A, the channel region 116 is formed by implanting a P-type dopant into a semiconductor substrate 100 such as a silicon substrate. A higher P-type dopant concentration in the channel region 116 increases the threshold voltage of the source-follower transistor that is an N-channel field effect transistor.

Thereafter, an initial gate 130a of the source-follower transistor is formed on the substrate 100 over the channel region 116. Subsequently, an N-type dopant with a relatively low concentration is implanted into both sides of the initial gate 130a within the semiconductor substrate 100 to form shallower portions of the source/drain regions 104 and 106. Thereafter, spacers are formed on both sidewalls of the initial gate 130a.

Subsequently after the spacers are formed, an N-type dopant with a relatively high concentration is implanted into both sides of the initial gate 130a extending from the shallow portions within the semiconductor substrate 100 to form deep portions of the source/drain regions 104 and 106. Such implantation of the N-type dopant is represented by the arrows N(180) in FIG. 6A. A mask pattern 142 is formed over the initial gate 130a in FIG. 6A during such implantation of the N-type dopant for preventing the N-type dopant from reaching the initial gate 130a.

Thereafter referring to FIG. 6B, the source-follower transistor is completed by implanting a P-type dopant into the initial gate 130a to form a final gate 130 having the P-type conductivity for the source-follower transistor. Such implantation of the P-type dopant to dope the gate 130 is represented by arrows P(182) in FIG. 6B. A mask pattern 142 is formed over the source/drain regions 104 and 106 in FIG. 6B during such implantation of the P-type dopant for preventing the P-type dopant from reaching the source/drain regions 104 and 106.

Figure 7:
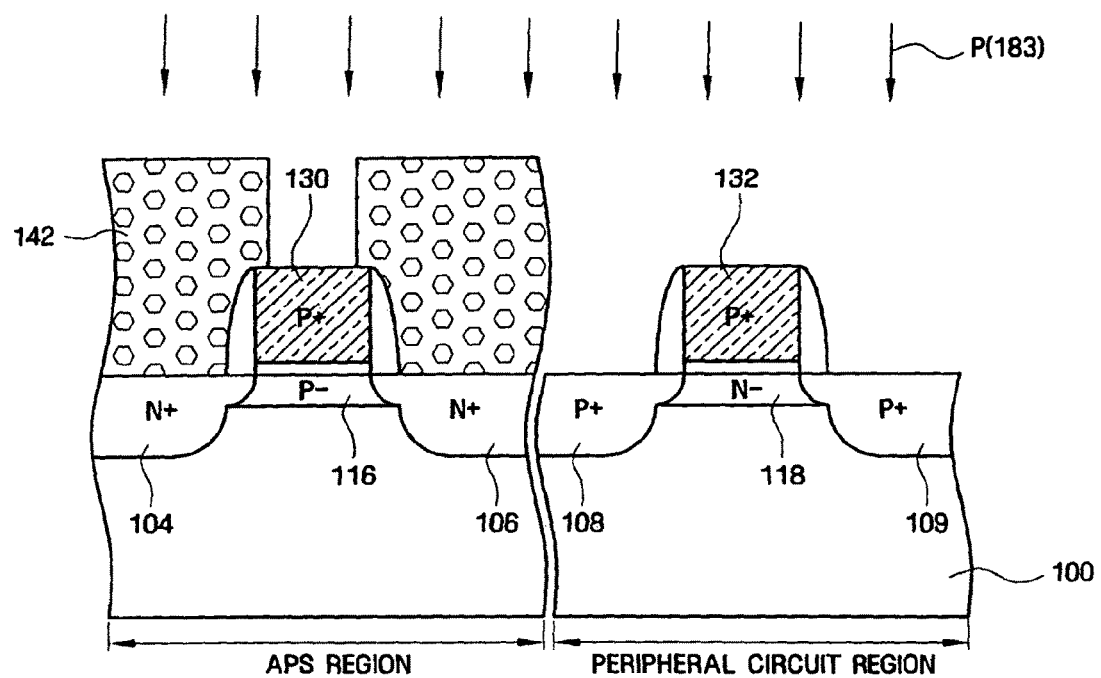
FIG. 7 illustrates a cross-sectional view during fabrication of the source-follower transistor of FIG. 3, according to another example embodiment of the present invention.

FIG. 7 shows a cross-sectional view illustrating fabrication of an image sensor according to another example embodiment of the present invention. Referring to FIG. 7, the implantation of the P-type dopant into the gate 130 of the source-follower transistor in an APS region for the image sensor on the substrate 100 is performed at the same time as implantation of the P-type dopant into a gate 132 and source/drain regions 108 and 109 of a PMOSFET (P-channel metal oxide semiconductor field effect transistor) in a peripheral circuit region on the substrate 100.

Such implantation of the P-type dopant is represented by arrows P(183) in FIG. 7. With such simultaneous implantation in both the APS region and the peripheral circuit region, the number of masks required for fabrication of the image sensor is minimized.

Figure 8:
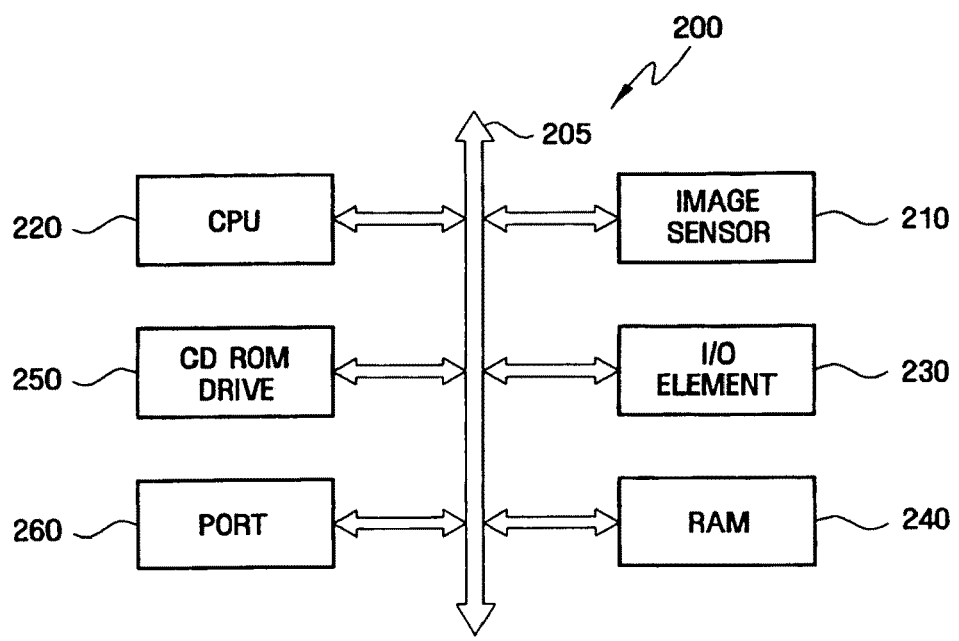
FIG. 8 illustrates a block diagram of a processor-based system including an image sensor according to an example embodiment of the present invention.

FIG. 8 shows a block diagram of a processor-based system 200 including a CMOS image sensor 210 according to an example embodiment of the present invention. Referring to FIG. 8, the processor-based system 200 processes an image generated by the CMOS image sensor 210. For example, the processor-based system 200 is a computer system, a camera system, a scanner, a mechanized clock system, a navigation system, a video phone, a surveillance system, an auto-focus system, a tracking system, a performance monitoring system, or an image stabilization system. However, the present invention is not restricted to such applications.

The processor-based system 200 such as a computer system includes a central processing unit (CPU) 220 such as a microprocessor which communicates with an input/output (I/O) element 230 via a bus 205. The CMOS image sensor 210 communicates with the processor-based system 200 via the bus 205 or another communication link.

The processor-based system 200 also includes a random access memory (RAM) 240, a compact disc-read only memory (CD-ROM) drive 250 and/or a port 260 for communicating with the CPU 220 via the bus 205. The port 260 is coupled to a video card, a sound card, a memory card or a universal serial bus (USB) card, or may communicate with a system other than the processor-based system 200. The CMOS image sensor 210 may be integrated with a CPU, a digital signal processor (DSP), or a microprocessor. The CMOS image sensor 210 may also be integrated with a memory. The CMOS image sensor 210 and the processor-based system 200 may be formed as separate integrated circuit chips.

In this manner, the selection transistor 19 is coupled between the source-follower transistor 17 and the voltage node N2 having the power supply voltage VDD or the boosted voltage VPP applied thereon for more stable operation of the source-follower transistor 17. In addition, the magnitude of the threshold voltage Vth$_1$ of the source-follower transistor 17 is greater than the magnitude of the threshold voltage Vth$_2$ of the selection transistor 19 for ensuring that the source-follower transistor 17 operates in saturation.

While the present invention has been particularly shown and described with reference to an exemplary embodiment thereof, it will be understood by those of ordinary skill in the art that various changes in form and details may be made therein without departing from the spirit and scope of the present invention as defined by the following claims.

The present invention is limited only as defined in the following claims and equivalents thereof.

What is claimed is:
1. An image sensor comprising:
   a photoelectric converter for generating electric charge in response to received light, wherein the electric charge varies a voltage of a detection node;
   a source-follower transistor coupled between the detection node and an output node and having a first threshold voltage; and a selection transistor coupled between the source-follower transistor and a voltage node and having a second threshold voltage with a magnitude that is less than a magnitude of the first threshold voltage, wherein the source-follower transistor includes a channel region with a conductivity opposite of a drain/source of the source-follower transistor.

2. The image sensor of claim 1, wherein the selection transistor and the source-follower transistor are enhancement type NMOSFETs (N-channel metal oxide semiconductor field effect transistors).

3. The image sensor of claim 2, wherein the source-follower transistor has a drain coupled to a source of the selection transistor, a gate coupled to the detection node, and a source coupled to the output node.

4. The image sensor of claim 3, wherein the selection transistor has a gate with a selection control signal applied thereon and a drain coupled to the voltage node.

5. The image sensor of claim 4, wherein respective voltages with a same level are applied on the gates of the selection transistor and the source-follower transistor.

6. The image sensor of claim 5, further comprising:
a reset transistor having a drain coupled to the voltage node, a gate with a reset control signal applied thereon, and a source coupled to the detection node,
wherein a power supply voltage is applied to the voltage node and to the gate of the selection transistor.

7. The image sensor of claim 4, wherein a first voltage is applied on the gate of the selection transistor, and wherein a second voltage that is higher than the first voltage is applied on the gate of the source-follower transistor.

8. The image sensor of claim 7, further comprising:
a reset transistor having a drain coupled to the voltage node, a gate with a reset control signal applied thereon, and a source coupled to the detection node,
wherein a boosted voltage is applied on the voltage node, and wherein a power supply voltage lower than the boosted voltage is applied on the gate of the selection transistor.

9. The image sensor of claim 2, wherein a gate of the source-follower transistor has a higher concentration of holes than a gate of the selection transistor.

10. The image sensor of claim 9, wherein the gate of the source-follower transistor has a P-type conductivity, and wherein the gate of the selection transistor has an N-type conductivity.

11. The image sensor of claim 1, further comprising:
a transfer transistor coupled between the photoelectric converter and the detection node.

12. The image sensor of claim 1, wherein the photoelectric converter is a photodiode, and wherein the image sensor is a CMOS (complementary metal oxide semiconductor) image sensor.

13. An image sensor comprising:
a photoelectric converter for generating electric charge in response to received light, wherein the electric charge varies a voltage of a detection node; and
a source-follower transistor coupled between the detection node and an output node, the source-follower transistor including;
respective source/drain regions of a first conductivity type formed in a semiconductor substrate;
a respective gate of a second conductivity type that is opposite of the first conductivity type; and
a respective channel region of said second conductivity type that is opposite of the first conductivity type of said respective source/drain regions.

14. The image sensor of claim 13, further comprising:
a selection transistor coupled between the source-follower transistor and a voltage node and having a respective threshold voltage with a magnitude that is less than a magnitude of a respective threshold voltage of the source-follower transistor.

15. The image sensor of claim 14, wherein the selection transistor includes:
respective source/drain regions of the first conductivity type formed in the semiconductor substrate;
a respective channel region with a dopant of the second conductivity type; and
a respective gate of the first conductivity type disposed over the respective channel region.

16. An image sensor comprising:
a photoelectric converter for generating electric charge in response to received light, wherein the electric charge varies a voltage of a detection node; and
a source-follower transistor coupled between the detection node and an output node, wherein the source-follower transistor includes:
a drain with a power supply voltage minus a respective threshold voltage of another transistor applied thereon; and
a gate with a boosted voltage applied thereon that is higher than said power supply voltage when a reset transistor is turned on.

17. The image sensor of claim 16, wherein the other transistor is a selection transistor coupled between the source-follower transistor and a voltage node and having the respective threshold voltage with a magnitude that is less than a magnitude of a respective threshold voltage of the source-follower transistor.

18. The image sensor of claim 17, wherein the magnitude of the respective threshold voltage of the source-follower transistor is higher than the magnitude of the respective threshold voltage of the selection transistor by at least the boosted voltage minus the power supply voltage.

19. The image sensor of claim 17, wherein the boosted voltage is applied on the gate of the source-follower transistor through said reset transistor, and wherein the power supply voltage minus the respective threshold voltage of the selection transistor is applied on the drain of the source-follower transistor.

* * * * *